(12) United States Patent
Cho et al.

(10) Patent No.: US 7,859,882 B2
(45) Date of Patent: Dec. 28, 2010

(54) RESISTIVE MEMORY DEVICE AND METHOD OF WRITING DATA

(75) Inventors: Woo-yeong Cho, Suwon-si (KR); Du-eung Kim, Yongin-si (KR); Sang-beom Kang, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 594 days.

(21) Appl. No.: 11/844,511

(22) Filed: Aug. 24, 2007

(65) Prior Publication Data

US 2008/0106924 A1    May 8, 2008

(30) Foreign Application Priority Data

Nov. 2, 2006    (KR) .................. 10-2006-0107946

(51) Int. Cl.
G11C 11/00    (2006.01)
(52) U.S. Cl. ...................... 365/148; 365/163
(58) Field of Classification Search .......... 365/46, 365/94, 100, 129, 148, 113, 163; 257/2–5, 257/296, E31.047, E27.006, E21.35; 438/29, 438/95, 96, 166, 259, 365, 482, 486, 597, 438/135; 977/754
See application file for complete search history.

(56) References Cited

U.S. PATENT DOCUMENTS

| | | | |
|---|---|---|---|
| 2005/0036366 A1* | 2/2005 | Ono | 365/185.01 |
| 2006/0067103 A1 | 3/2006 | Ferrant et al. | |
| 2006/0284157 A1* | 12/2006 | Chen et al. | 257/2 |
| 2006/0284158 A1* | 12/2006 | Lung et al. | 257/2 |
| 2006/0284279 A1* | 12/2006 | Lung et al. | 257/528 |
| 2006/0286709 A1* | 12/2006 | Lung et al. | 438/102 |
| 2007/0138458 A1* | 6/2007 | Lung | 257/4 |
| 2007/0155172 A1* | 7/2007 | Lai et al. | 438/666 |
| 2007/0165442 A1* | 7/2007 | Hosoi et al. | 365/100 |
| 2007/0262388 A1* | 11/2007 | Ho et al. | 257/363 |
| 2007/0285972 A1* | 12/2007 | Horii et al. | 365/148 |
| 2008/0197334 A1* | 8/2008 | Lung | 257/2 |

FOREIGN PATENT DOCUMENTS

| | | | |
|---|---|---|---|
| JP | 2005251381 | | 9/2005 |
| JP | 2007310956 A | * | 11/2007 |
| KR | 1020060030237 A | | 4/2006 |

* cited by examiner

*Primary Examiner*—Richard Elms
*Assistant Examiner*—Harry W Byrne
(74) *Attorney, Agent, or Firm*—Volentine & Whitt, PLLC

(57) ABSTRACT

A resistive memory device is provided. The resistive memory device includes word lines arranged in M rows, bit lines arranged in N columns, local source lines arranged in M/2 rows, and resistive memory cells arranged in M rows and N columns. Each of the resistive memory cells includes a resistance variable element having a first electrode connected to a corresponding bit line, and a cell transistor having a first terminal connected to a second electrode of the resistance variable element, a second terminal connected to a corresponding local source line, and a control terminal connected to a corresponding word line. The local source line is commonly connected to the second terminals of the cell transistors of the two neighboring rows.

10 Claims, 6 Drawing Sheets

RESISTIVE MEMORY DEVICE AND METHOD OF WRITING DATA

CROSS-REFERENCE TO RELATED PATENT APPLICATION

This application claims the benefit of Korean Patent Application No. 10-2006-0107946, filed on Nov. 2, 2006, the subject mater of which is hereby incorporated by reference.

BACKGROUND OF THE INVENTION

1. Field of the Invention

The present invention relates to a resistive memory device and a method of writing data in relation to same. More particularly, the invention relates to a resistive memory device in which a single local source line is connected to cell transistors corresponding to the two neighboring rows and a method of writing data in relation to same.

2. Description of the Related Art

Ideal next-generation memory devices would have the high integration density of a Dynamic Random Access Memories (DRAM), the non-volatile storage capabilities of a flash memory, and the high operating speed of a Static Random Access Memory (SRAM). Phase change RAM (PRAM), Nano Floating Gate Memory (NFGM), Polymer RAM (PoRAM), Magnetic RAM (MRAM), Ferroelectric RAM (FERAM) and Resistive RAM (RRAM) have all been discussed as possible alternatives to the implementation of next-generation memory devices.

Figure 1A:
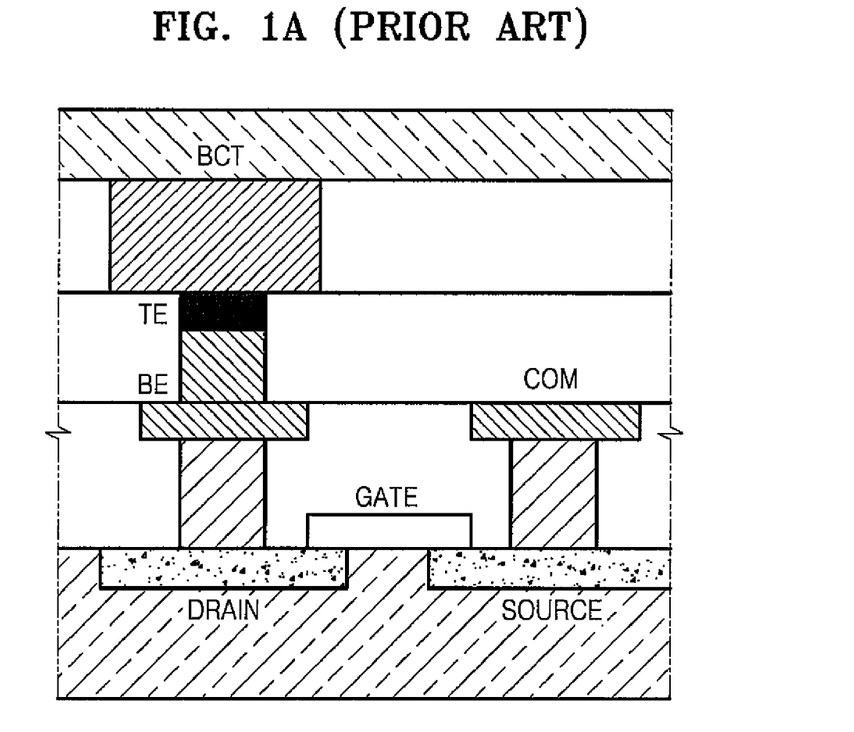
FIG. 1A illustrates a cell structure of a conventional resistive memory device (RRAM)
Figure 1B:
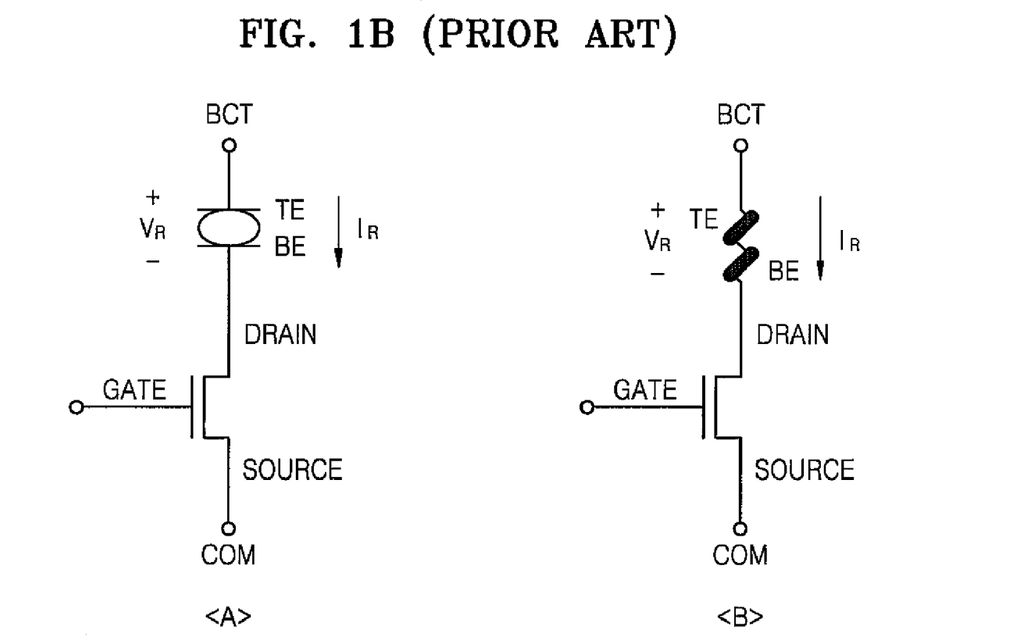
FIG. 1B is a circuit diagram illustrating an equivalent model of a resistive memory cell illustrated in FIG. 1A.

Amongst these alternatives, the RRAM writes data using a resistance variation associated with a resistance variable element. FIG. (FIG.) 1A illustrates a general cell structure for a RRAM. FIG. 1B shows alternate (<A> and <B>) equivalent circuit diagrams for the general resistive memory cell shown in FIG. 1A.

The resistive memory cell includes a single resistance variable element and a single cell transistor. The resistance variable element includes a first electrode (top electrode) TE, a second electrode (bottom electrode) BE, and a resistance variable material interposed between the first electrode TE and the second electrode BE. The cell transistor includes a first terminal DRAIN, a second terminal SOURCE and a control terminal GATE. The first electrode TE of the resistance variable element is connected to a corresponding bit line (not shown) through a bit line connecting terminal BCT. The second terminal SOURCE of the cell transistor is connected to a common terminal COM.

The resistance of the resistance variable material varies according to a voltage VR or current IR applied thereto. The resistance of a uni-directional resistance variable material varies according to the magnitude of voltage VR or current IR applied thereto while the resistance of a bi-directional resistance variable material varies according to the magnitude and polarity of voltage VR or current IR applied thereto.

Figure 2:
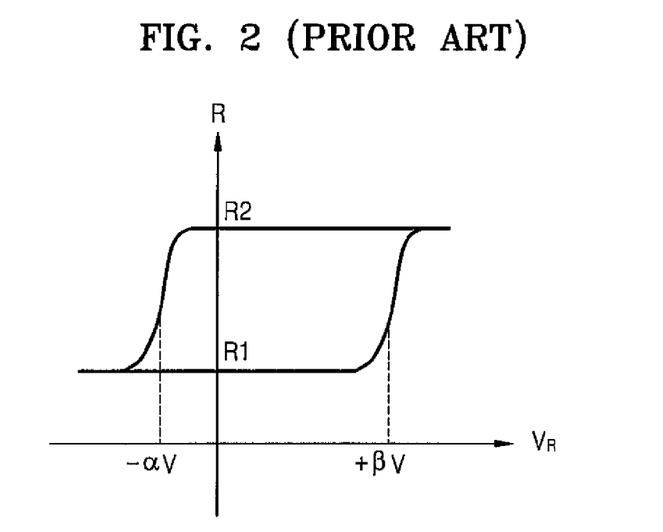
FIG. 2 is a graph illustrating a resistance characteristic of a bi-directional resistive variable material.

FIG. 2 is a graph illustrating model resistance characteristics for a bi-directional resistance variable material. In FIG. 2, the horizontal axis indicates a voltage VR applied to the resistance variable material and the vertical axis indicates the corresponding resistance R of the resistance variable material. $\alpha$ and $\beta$ are indexes indicating the VR-R characteristics of the resistance variable substance.

When voltage VR greater (more positive) than $+\beta V$ is applied to the resistance variable material having a first resistance R1, the first resistance R1 of the resistance variable material is changed a second resistance R2. When a voltage VR greater than $-\alpha V$ (more negative) is applied to the resistance variable material having the second resistance R2, the second resistance R2 of the resistance variable material is changed to the first resistance R1. In this manner, logically "high" data or logically "low" data may be written to the resistance variable material by controlling the magnitude and polarity (+ or −) of voltage VR or current IR applied to the resistance variable material. For example, the resistance variable material having the first resistance R1 may correspond to a "high" data state being written to the resistance variable material, and the resistance variable material having the second resistance R2 may correspond to a "low" data state being written to the resistance variable material.

Figure 3A:
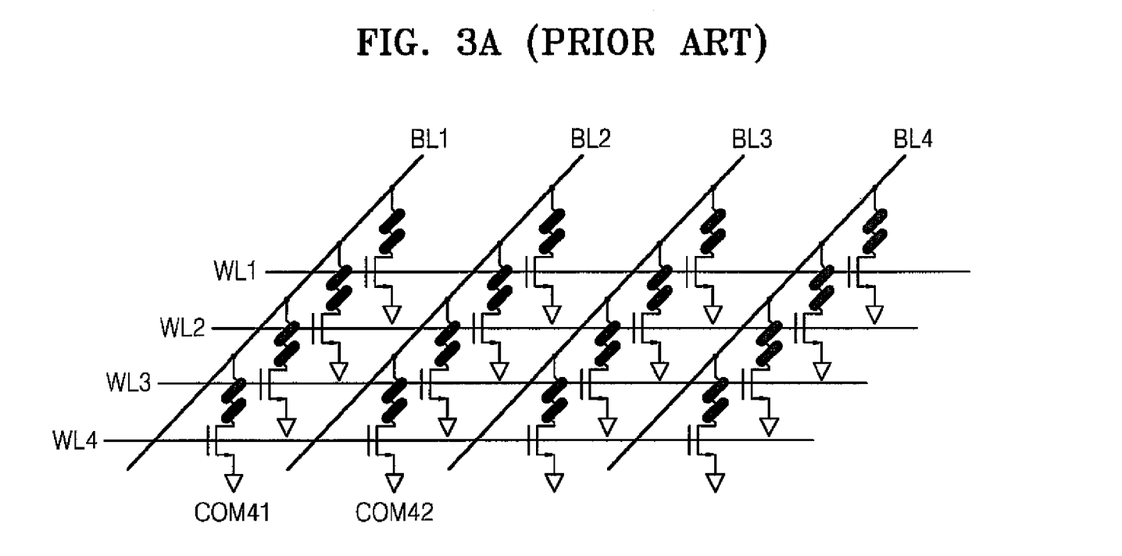
FIG. 3A illustrates a cell array structure of a conventional uni-directional resistive memory device.
Figure 3B:
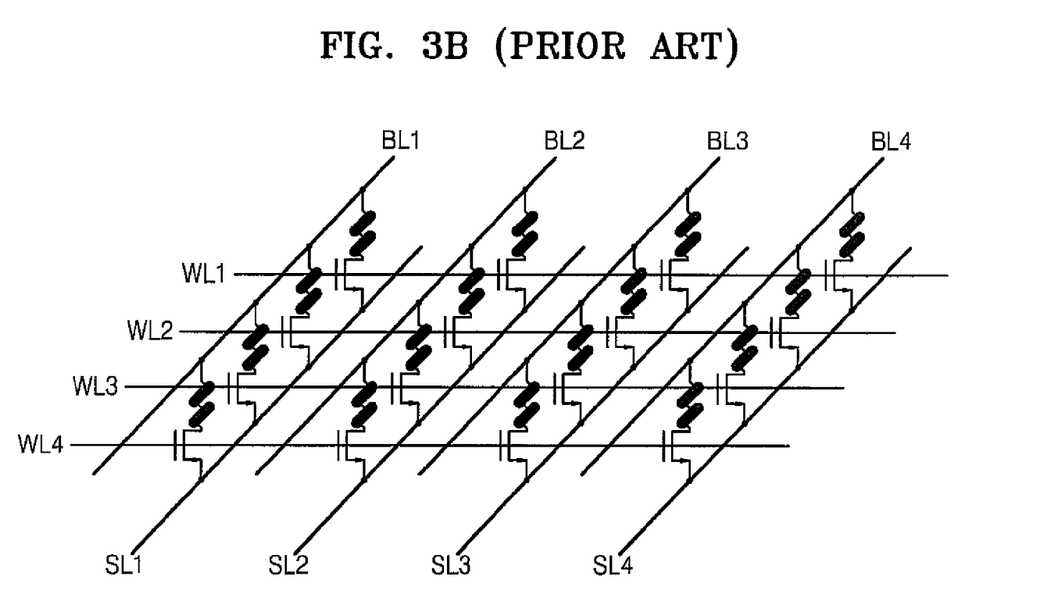
FIG. 3B illustrates a cell array structure of a conventional bi-directional resistive memory device.

FIG. 3A illustrates a cell array structure of a conventional uni-directional resistive memory device and FIG. 3B illustrates a cell array structure of a conventional bi-directional resistive memory device.

Referring to FIG. 3A, the uni-directional resistive memory device includes first, second, third and fourth bit lines BL1, BL2, BL3 and BL4, first, second, third and fourth word lines WL1, WL2, WL3 and WL4, and resistive memory cells in four rows and four columns. Common terminals (COM41, COM42, ...) of the resistive memory cells may be connected if required.

Referring to FIG. 3B, the bi-directional resistive memory device includes first, second, third and fourth bit lines BL1, BL2, BL3 and BL4, first, second, third and fourth word lines WL1, WL2, WL3 and WL4, first, second, third and fourth source lines SL1, SL2, SL3 and SL4, and resistive memory cells in four rows and four columns. In the bi-directional resistive memory device, the word line corresponding to a certain row is activated to turn ON cell transistors corresponding to the word line and voltages are applied to the bit lines and source lines corresponding to the word line such that high-level data or low-level data can be written to the resistive memory cells corresponding to the cell transistors.

In addition to the cell array structures illustrated in FIGS. 3A and 3B, a variety of cell array structures for improving the integration and capacity of resistive memory device are being proposed.

SUMMARY OF THE INVENTION

Embodiments of the invention provide a resistive memory device having a cell array structure suitable for high integration and large capacity, and a method of writing data in relation to the resistive memory device.

In one embodiment, the invention provides a resistive memory device comprising; word lines arranged in M rows, bit lines arranged in N columns, local source lines arranged in M/2 rows, and resistive memory cells arranged in M rows and N columns, wherein each of the resistive memory cells comprises a resistance variable element having a first electrode connected to a corresponding bit line, and a cell transistor having a first terminal connected to a second electrode of the resistance variable element, a second terminal connected to a corresponding local source line, and a control terminal connected to a corresponding word line, and wherein the local source line is commonly connected to the second terminals of the cell transistors of the two neighboring rows.

In another embodiment, the invention provides a method of writing data to a resistive memory device including word lines arranged in M rows, bit lines arranged in N columns, local source lines arranged in M/2 rows, and resistive memory cells arranged in M rows and N columns each comprising a resistance variable element connected to a corresponding bit line and a cell transistor connected to a corresponding local source line. The method comprises activating the word line to turn ON the cell transistors corresponding to the word line, applying a first high voltage to the local source line which is commonly connected to the cell transistors corresponding to the two neighboring rows, and applying a low voltage to the bit line connected to a resistance variable element to which data will be written such that high data is written to the resistance variable element, and activating the word line to turn ON the cell transistors corresponding to the word line, applying a second high voltage to the bit line connected to a resistance variable element to which data will be written, and applying a low voltage to the local source line, which is commonly connected to the cell transistors corresponding to the two neighboring rows, such that low data is written to the resistance variable element.

BRIEF DESCRIPTION OF THE DRAWINGS

Embodiments of the invention will be described with reference to the attached drawings in which.

DESCRIPTION OF EMBODIMENTS

Embodiments of the invention will now be described with reference to the accompanying drawings. The invention may, however, be embodied in many different forms and should not be construed as being limited to only the illustrated embodiments. Rather, these embodiments are presented as teaching examples. Throughout the written description and drawings, like reference numerals refer to like or similar elements.

Figure 4:
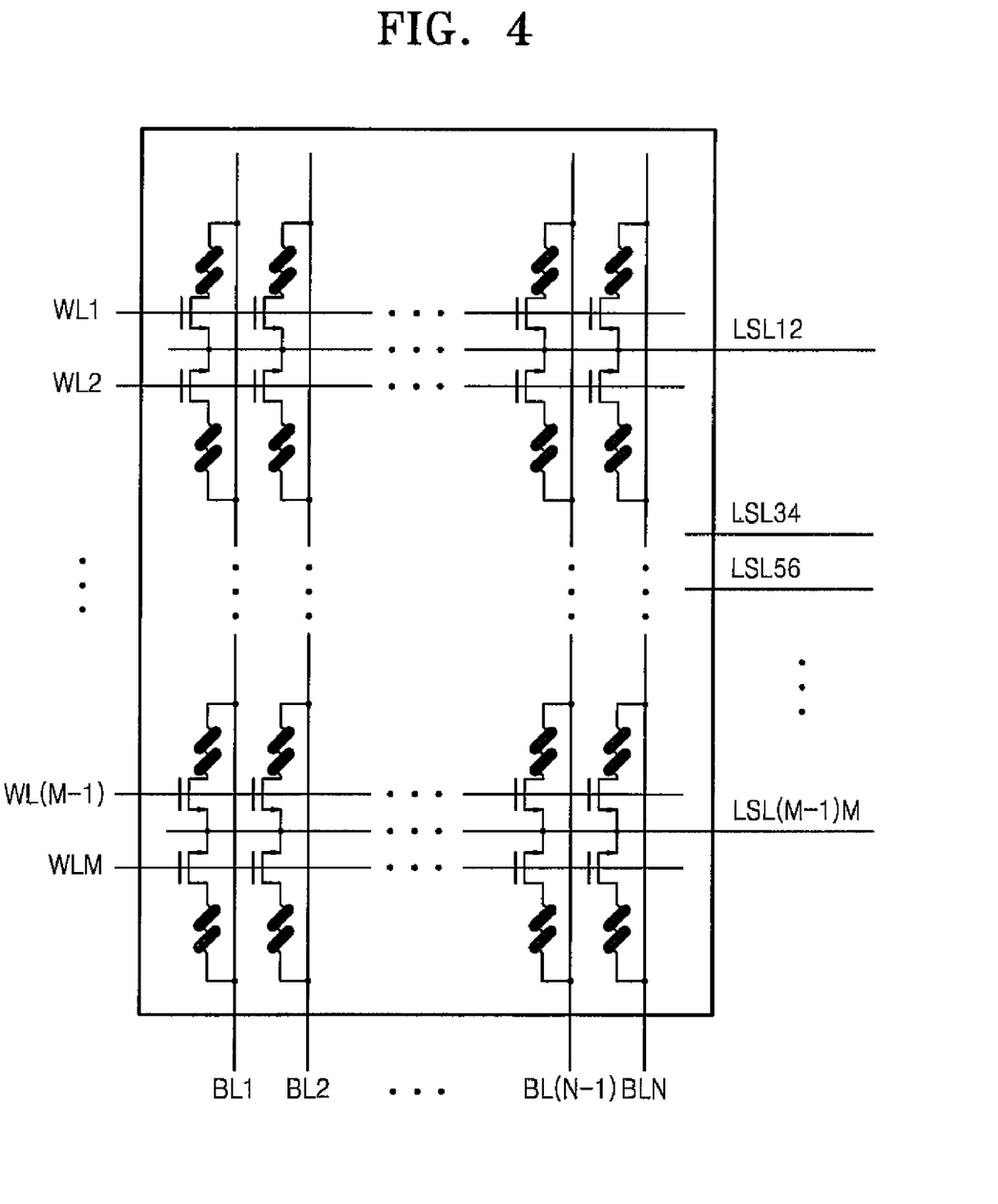
FIG. 4 illustrates a cell array structure of a resistive memory device according to an embodiment of the present invention.

FIG. 4 illustrates a cell array structure of a resistive memory device according to an embodiment of the invention. Referring to FIG. 4, the resistive memory device includes word lines WL1 through WLM arranged in M rows, bit lines BL1 through BLN arranged in N columns, local source lines LSL12, LSL34, LSL56, . . . , LSL(M−1)M arranged in M/2 rows, and resistive memory cells arranged in M rows and N columns.

As illustrated in FIG. 4, each resistive memory cell includes a resistance variable element and a cell transistor. A first electrode of the resistance variable element is connected to a corresponding bit line BLn and a second electrode of the resistance variable element is connected to the cell transistor. A first terminal of the cell transistor is connected to a second electrode of the resistance variable element, a second terminal of the cell transistor is connected to a corresponding local source line (LSL(m−1)m, when "m" is an even number and LSLm(m+1) when "m" is an odd number), and a control terminal of the cell transistor is connected to a corresponding word line WLm. The word line WLm corresponding to the mth row, where "m" is a natural number selected from the group 1 through M, is commonly connected to the control terminals of the cell transistors corresponding to the mth row, and the bit line BLn corresponding to the nth column, where "n" is a natural number selected from the group 1 through N, is commonly connected to the first electrodes of the resistance variable elements corresponding to the nth column.

In the resistive memory device according to the illustrated embodiment of the invention, in particular, a local source is commonly connected to the second terminals of the cell transistors corresponding to the two neighboring rows. That is, the (m/2)th local source line is commonly connected to the second terminals of the cell transistors corresponding to the (m−1)th row and the second terminals of the cell transistors corresponding to the mth row when m is an even number. When m is an odd number, the [(m+1)/2]th local source line is commonly connected to the second terminals of the cell transistors corresponding to the mth row and the second terminals of the cell transistors corresponding to the (m+1)th row. Accordingly, a resistive memory device designed and implemented according to an embodiment of the invention may be more highly integrated than a conventional bi-directional resistive memory device, such as the one illustrated in FIG. 3B, for example. As a result, the cell array structure illustrated in FIG. 4 is particularly well suited to the implementation of a large-capacity resistive memory device.

An exemplary operating scheme for writing logically "high" data or logically "low" data to the resistive memory device illustrated in FIG. 4 will now be explained.

When data is written to the resistive memory cell corresponding to the mth row and the nth column, the word line WLm of the mth row is activated to turn ON the cell transistors corresponding to the mth row. A first high voltage (e.g., $|-\alpha|V$ as illustrated in FIG. 2) or a low voltage (e.g., ground) may be applied to a corresponding local source line (LSL(m−1)m when m is an even number and LSLm(m+1) when m is an odd number), and the low voltage or a second high voltage (e.g., $|+\beta|V$, as illustrated in FIG. 2) is applied to a corresponding bit line BLn.

Specifically, an operation of turning ON the cell transistors corresponding to the mth row, applying the first high voltage (e.g., $|-\alpha|V$) to the corresponding local source line (LSL(m−1)m when m is an even number and LSLm(m+1) when m is an odd number) and applying the low voltage (e.g., ground) to the corresponding bit line BLn can be considered as an operation of writing high data to the resistive memory cell corresponding to the mth row and the nth column. In this operation, the resistive memory cell corresponding to the mth row and the nth column has a first resistance (R1) because $-\alpha V$ is applied to the resistive memory cell corresponding to the mth row and the nth column. The state of resistive memory cell having the first resistance (R1) may be defined as the state indicating high data. Here, to apply a voltage VR greater than $-\alpha V$ to the resistance variable material of the resistive memory cell, the first high voltage must be greater than $(|-\alpha|+Vth)V$ in relation to the threshold voltage (Vth) of the cell transistor associated with the resistive memory cell.

Furthermore, the operation of turning ON the cell transistors corresponding to the mth row, applying the low voltage (e.g., ground) to the local source line (LSL(m−1)m when m is an even number and LSLm(m+1) when m is an odd number) and applying the second high voltage (e.g., $+\beta V$) to the bit line BLn can be considered as an operation of writing low data to the resistive memory cell corresponding to the mth row and the nth column. In this operation, the resistive memory cell corresponding to the mth row and the nth column has a second resistance (R2) because $+\beta V$ is applied to the resistive memory cell corresponding to the mth row and the nth column. The state of resistive memory cell having the second resistance (R2) may be defined as a state indicating low data. To apply a voltage VR greater than +βV to the resistance variable material of the resistive memory cell, the second high voltage must be greater than (β+Vth) because of the threshold voltage (Vth) of the cell transistor associated with the resistive memory cell.

It will be understood by those of ordinary skill in the art that the state in which a resistive memory cell has the first resistance (R1) can alternately be related to the state indicating low data, and the state in which a resistive memory cell has the second resistance (R2) can be related to the state indicating high data. However, the operation of writing data to resistive memory cells in the present embodiment is described in relationship to the former indications made by the first resistance (R1) and the second resistance (R2).

In the illustrated embodiment, the operation of writing high data to resistive memory cells may be executed on a cell-by-cell, a row-by-row (by N resistive memory cells), or a block-by-block (by M×N resistive memory cells) basis, but the operation of writing low data to resistive memory cells is carried out on a cell-by-cell basis.

When high data is written to the resistive memory cell corresponding to the mth row and the nth column cell by cell, the word line WLm of the mth row is activated to turn ON the cell transistors of the mth row, the first high voltage |−α|+Vth is applied to the corresponding local source line (LSL(m−1)m when m is an even number and LSLm(m+1) when m is an odd number), and ground voltage is applied to the corresponding bit line BLn.

When high data is written to the resistive memory cells corresponding to the mth row, the word line WLm of the mth row is activated to turn on the cell transistors corresponding to the mth row, the first high voltage |−α|+Vth is applied to the corresponding local source line (LSL(m−1)m when m is an even number and LSLm(m+1) when m is an odd number), and ground voltage is applied to the first through Nth bit lines BL1 through BLN. Otherwise, ground voltage is applied to only the bit lines corresponding to specific resistive memory cells among the resistive memory cells corresponding to the mth row to which the high-level data will be written. In this case, the high-level data is written to only the specific resistive memory cells among the resistive memory cells corresponding to the mth row.

When high-level data is written to the M×N resistive memory cells block by block, the first through Mth word lines WL1 through WLM are activated to turn ON all the M×N cell transistors, the first high voltage |−α|+Vth is applied to the first through (M/2)th local source lines LSL12 through LSL(M−1)M, and ground voltage is applied to the first through Nth bit lines BL1 through BLN.

When low-level data is written to the resistive memory cell corresponding to the mth row and the nth column, the word line WLm of the mth row is activated to turn ON the cell transistors corresponding to the mth row, ground voltage is applied to the corresponding local source line (LSL(m−1)m when m is an even number and LSLm(m+1) when m is an odd number), and the second high voltage (β+Vth) is applied to the corresponding bit line BLn.

The operation of writing high data to resistive memory cells row by row or block by block is similar to the erase operation of a flash memory device. When high-level data is written to resistive memory cells on a row-by-row or a block-by-block basis, and low data is written to resistive memory cells on a cell-by-cell basis, the operation of writing high data to the resistive memory cells must be carried out prior to the operation of writing low data. Performing the operation of writing high data on a row-by-row or a block-by-block basis and then the operation of writing low data within an embodiment of the present invention is similar to executing an erase operation on a block-by-block basis and then executing a programming operation on a page-by-page basis in a conventional flash memory device.

Furthermore, it is also possible to apply |+β|V to a local source line to write high data to a corresponding resistive memory cell and apply |−α|V to a bit line to write low data to a corresponding resistive memory cell. However, the scheme of applying |−α|V to a local source line to write high data to a corresponding resistive memory cell and applying |+β|V to a bit line to write low data to a corresponding resistive memory cell is more advantageous in terms of power consumption since |−α| is lower than |+β|V, as illustrated in FIG. 2. This is because the local source line is commonly connected to the second terminals of the cell transistors corresponding to the two neighboring rows in the cell array structure of the resistive memory device according to the illustrated embodiment of the invention. Accordingly, the first high voltage applied to a local source line is set such that it is lower than the second high voltage applied to a bit line.

Figure 5A:
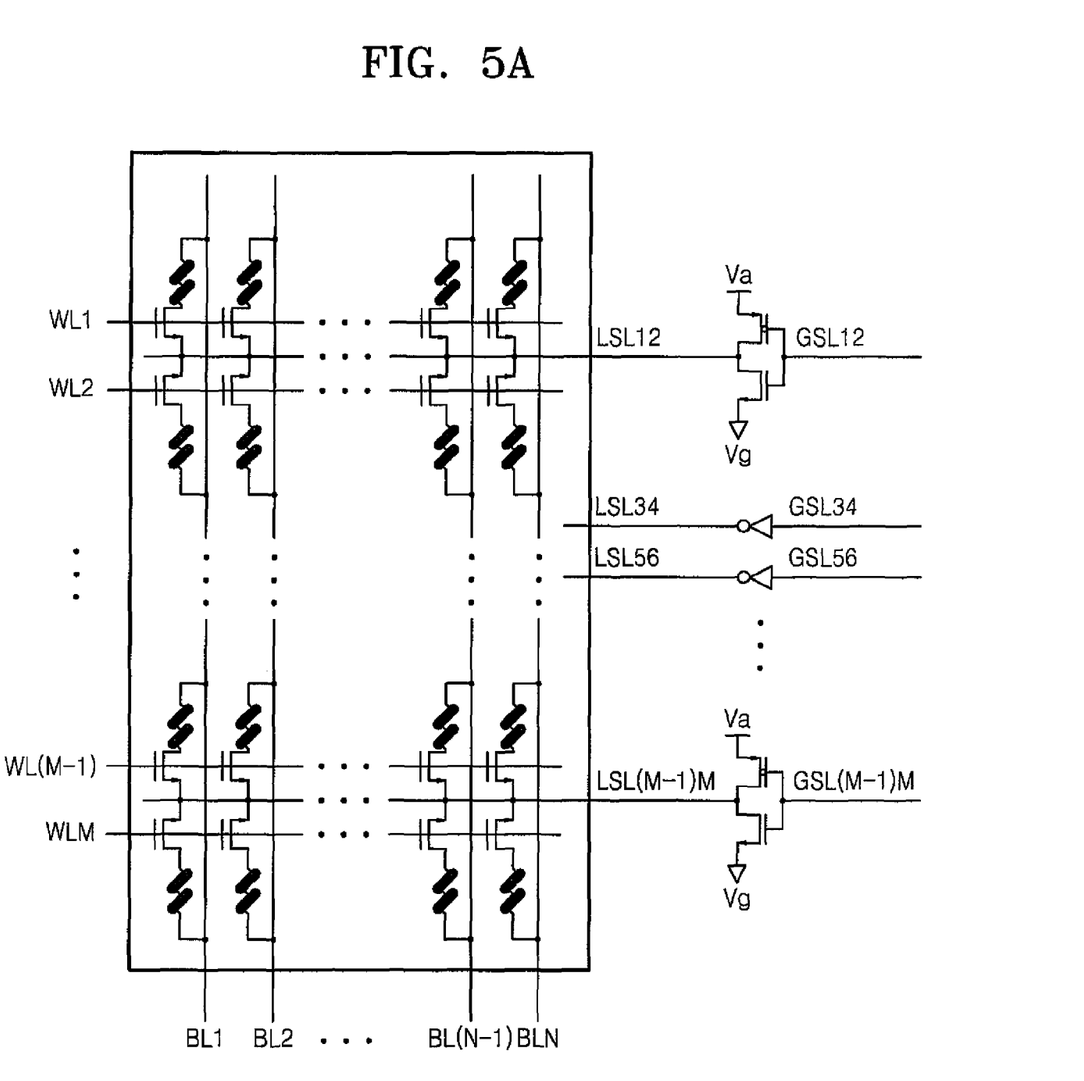
FIG. 5A illustrates a resistive memory device according to an embodiment of the present invention.

FIG. 5A illustrates a resistive memory device according to another embodiment of the invention. Referring to FIG. 5, the resistive memory device according to the current embodiment of the present invention includes word lines WL1 through WLM arranged in M rows, bit lines BL1 through BLN arranged in N columns, resistive memory cells arranged in M rows and N columns, M/2 local source lines LSL12, LSL34, LSL56, . . . , LSL(M−1)M, M/2 global source lines GSL12, GSL34, GSL56, . . . , GSL(M−1)M.

M/2 inverters are respectively connected to the M/2 local source lines LSL12, LSL34, LSL56, . . . , LSL(M−1)M and the M/2 global source lines GSL 12, GSL34, GSL56, . . . , GSL(M−1)M. Each of the M/2 inverters includes a high level transistor and a low level transistor. The high level transistor transfers a first high voltage (Va=|−α|+Vth) to the corresponding local source line in response to the voltage of the corresponding global source line. The low level transistor transfers a low voltage (Vg=ground) to the corresponding local source line in response to the voltage of the corresponding global source line. The (m/2)th inverter functions as a driver driving the local source line LSL(m−1)m in response to the voltage of the global source line GSL(m−1)m.

When high data or low data is written to the resistive memory cell corresponding to the mth row, where "m" is a natural number selected from the group 1 through M) and the nth column, where "n" is a natural number selected from the group 1 through N, the word line WLm of the mth row, the bit line BLn of the nth column, the local source line LSL(m−1)m of the (m/2)th row (the local source line LSLm(m+1) of the [(m+1)/2]th row when m is an odd number), the (m/2)th inverter (the [(m+1)/2]th inverter when m is an odd number), and the (m/2)th global source line GSL(m−1)m (the [(m+1)/2]th global source line GSLm(m+1) when m is an odd number) participate in the writing operation.

Figure 5B:
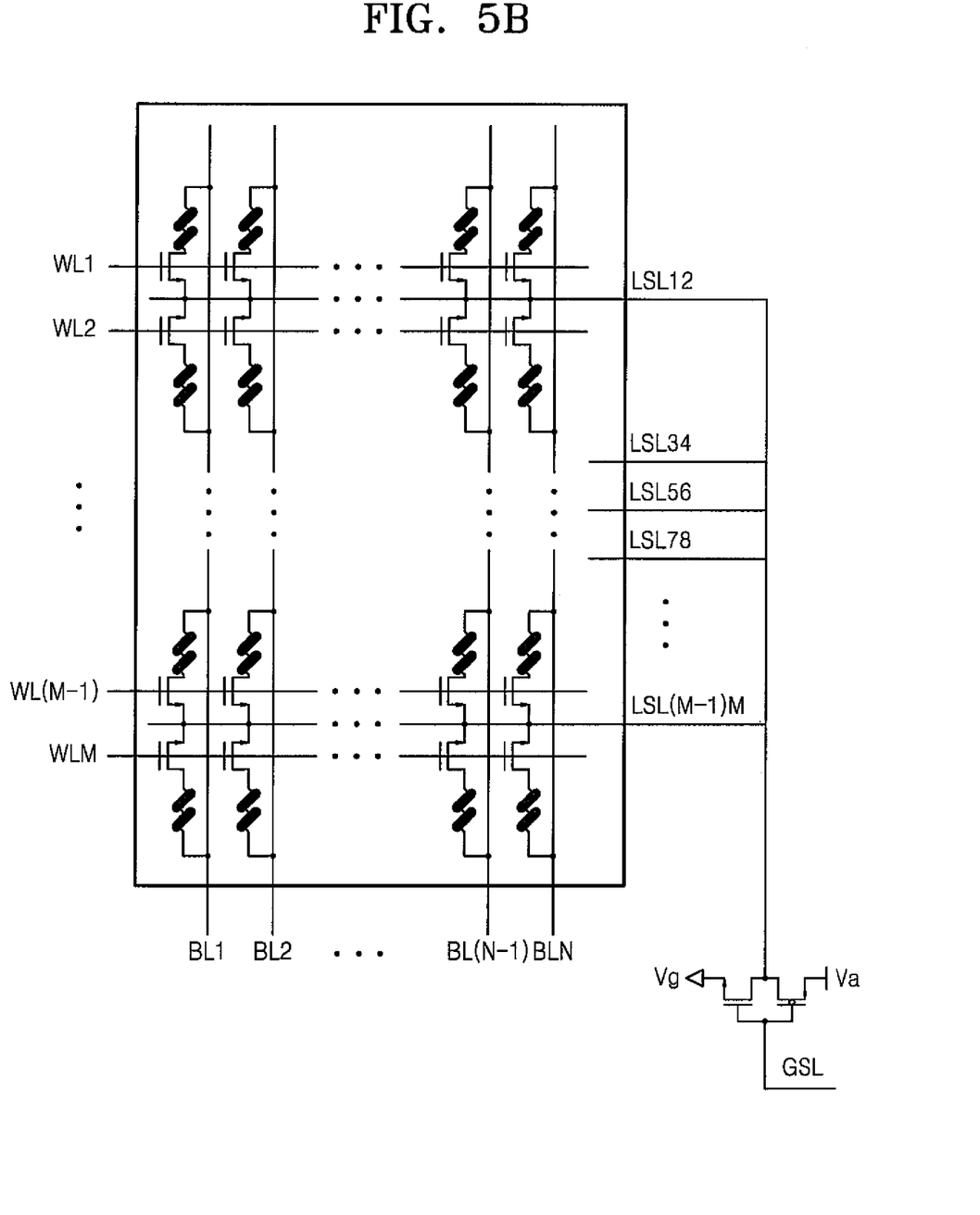
FIG. 5B illustrates a resistive memory device according to another embodiment of the present invention.

FIG. 5B illustrates a resistive memory device according to another embodiment of the invention. Referring to FIG. 5B, the resistive memory device according to the illustrated embodiment of the invention includes word lines WL1 through WLM arranged in M rows, bit lines BL1 through BLN arranged in N columns, resistive memory cells arranged in M rows and N columns, M/2 local source lines LSL12, LSL34, LSL56 . . . , LSL(M−1)M, which are connected, a single inverter, and a single global source line GSL.

The inverter is connected to the M/2 local source lines LSL12, LSL34, LSL56 . . . , LSL(M−1)M and the global source line GSL. The inverter includes a high level transistor and a low level transistor. The high level transistor transfers a first high voltage (Va (=|−α|+Vth)) to the M/2 local source lines LSL12, LSL34, LSL56, . . . LSL(M−1)M in response to the voltage of the global source line GSL. The low level transistor transfers a low voltage (Vg=ground) to the M/2 local source lines LSL12, LSL34, LSL56 . . . , LSL(M−1)M in response to the voltage of the global source line GSL. The inverter functions as a driver driving the M/2 local source lines LSL12, LSL34, LSL56 . . . , LSL(M−1)M in response to the voltage of the global source line GSL.

When high data or low data is written to the resistive memory cell corresponding to the mth row, where "m" is a natural number selected from the group 1 through M, and the nth column, where "n" is a natural number selected from the group 1 through N, the word line WLm of the mth row, the bit line BLn of the nth column, the M/2 local source lines LSL12, LSL34, LSL56 . . . , LSL(M−1)M, the inverter and the global source line GSL participate in the writing operation.

The power consumption of the resistive memory device illustrated in FIG. 5A is lower than that of the resistive memory device illustrated in FIG. 5B because the local source lines of the resistive memory device illustrated in FIG. 5A are independently driven. However, the integration density for the resistive memory device illustrated in FIG. 5B is higher than that of FIG. 5A because the resistive memory device illustrated in FIG. 5B requires only a single inverter. That is, the resistive memory device illustrated in FIG. 5A is superior in terms of power consumption and the resistive memory device illustrated in FIG. 5B is superior in terms of integration density.

A method of writing data to a resistive memory device including word lines WL1 through WLM arranged in M rows, bit lines BL1 through BLN arranged in N columns, M/2 local source lines LSL12, LSL34, LSL56, . . . , LSL(M−1)M, and resistive memory cells arranged in M rows and N columns each having a resistance variable element connected to a corresponding bit line BLn and a cell transistor connected to a corresponding local source line LSL(m−1)m or LSLm(M+1) according to another embodiment of the invention will now be explained.

An operation of writing high data to the resistive memory cell corresponding to the mth row and the nth column will be explained first.

The word line WLm of the mth row is activated to turn ON the cell transistors corresponding to the word line WLm. A first high voltage (Va=|−α|+Vth) is applied to the local source line (LSL(m−1)m when m is an even number and LSLm(m+1) when m is an odd number) commonly connected to the cell transistors corresponding to the mth row and a neighboring row (the (m−1)th row when m is an even number and (m+1)th row when m is an odd number). A low voltage (Vg=ground) is applied to the bit line BLn connected to a resistance variable element to which data will be written.

An operation of writing low data to the resistive memory cell corresponding to the mth row and the nth column will now be explained.

The word line WLm of the mth row is activated to turn ON the cell transistors corresponding to the word line WLm. A second high voltage (Vb=|+β|+Vth) is applied to the bit line BLn connected to a resistance variable element to which the low-level data will be written. The low voltage (Vg=ground) is applied to the local source line (LSL(m−1)m when m is an even number and LSLm(m+1) when m is an odd number) commonly connected to the cell transistors corresponding to the mth row and a neighboring row (the (m−1)th row when m is an even number and (m+1)th row when m is an odd number).

The local source line is commonly connected to the cell transistors of the two neighboring rows in the illustrated embodiments of the invention, and thus it is advantageous that the first high voltage applied to the local source line be lower than the second high voltage applied to the bit line in terms of power consumption.

In the method of writing data to a resistive memory device according to the current embodiment of the present invention, the operation of writing high data may be carried out on a cell-by-cell, a row-by-row (by N resistive memory cells), or a block-by-block (by M×N resistive memory cells) basis, and the operation of writing low data may be executed on a cell-by-cell basis.

When high data is written on a row-by-row, or block-by-block basis and low data is written on a cell-by-cell basis, the operation of writing high data is performed prior to the operation of writing low data.

As described above, the local source line is commonly connected to the cell transistors of the two neighboring rows in the cell array structure of the resistive memory device according to embodiments of the invention. Accordingly, the integration of the resistive memory device can be improved.

While the present invention has been particularly shown and described with reference to exemplary embodiments thereof, it will be understood by those of ordinary skill in the art that various changes in form and details may be made therein without departing from the scope of the present invention as defined by the following claims.

What is claimed is:

1. A resistive memory device comprising:
   word lines arranged in M rows;
   bit lines arranged in N columns;
   local source lines arranged in M/2 rows;
   M/2 inverters respectively connected to the M/2 local source lines;
   M/2 global source lines respectively connected to the M/2 inverters, and
   resistive memory cells arranged in M rows and N columns, wherein each of the resistive memory cells comprises a resistance variable element having a first electrode connected to a corresponding bit line, and a cell transistor having a first terminal connected to a second electrode of the resistance variable element, a second terminal connected to a corresponding local source line, and a control terminal connected to a corresponding word line, and
   the local source line is commonly connected to the second terminals of the cell transistors of the two neighboring rows.

2. The resistive memory device of claim 1, wherein the word line of the mth row, "m" being a natural number selected from the group 1 through M, is commonly connected to the control terminals of the cell transistors corresponding to the mth row, and the bit line of the nth column, "n" being a natural number selected from the group 1 through N, is commonly connected to the first electrodes of the resistance variable elements corresponding to the nth column.

3. The resistive memory device of claim 1, wherein each of the M/2 inverters comprises:
   a high level transistor transferring the first high voltage to a corresponding local source line in response to the voltage of a corresponding global source line; and
   a low level transistor transferring the low voltage to the corresponding local source line in response to the voltage of the corresponding global source line.

4. The resistive memory device of claim 1, further comprising:
   a single inverter commonly connected to the M/2 local source lines; and
   a single global source line connected to the single inverter.

5. The resistive memory device of claim 4, wherein the single inverter comprises:
   a high level transistor transferring the first high voltage to the local source lines in response to the voltage of the single global source line; and
   a low level transistor transferring the low voltage to the local source lines in response to the voltage of the single global source line.

6. A method of writing data to a resistive memory device including word lines arranged in M rows, bit lines arranged in N columns, local source lines arranged in M/2 rows, and resistive memory cells arranged in M rows and N columns each comprising a resistance variable element connected to a corresponding bit line and a cell transistor connected to a corresponding local source line, comprising:
   activating the word line to turn ON the cell transistors corresponding to the word line, applying a first high voltage to the local source line which is commonly connected to the cell transistors corresponding to the two neighboring rows, and applying a low voltage to the bit line connected to a resistance variable element to which data will be written such that high data is written to the resistance variable element; and
   activating the word line to turn ON the cell transistors corresponding to the word line, applying a second high voltage to the bit line connected to a resistance variable element to which data will be written, and applying a low voltage to the local source line, which is commonly connected to the cell transistors corresponding to the two neighboring rows, such that low data is written to the resistance variable element.

7. The method of claim 6, wherein high data is written on a cell-by-cell, a row-by-row, or a block-by-block basis.

8. The method of claim 6, wherein low data is written on a cell-by-cell basis.

9. The method of claim 6, wherein, when high data is written on a row-by-row or block by block basis, and low data is written on a cell-by-cell basis, the operation of writing high data is carried out prior to the operation of writing low data.

10. The method of claim 6, wherein the first high voltage is lower than the second high voltage.

* * * * *